United States Patent
Pak

(10) Patent No.: US 11,162,979 B2
(45) Date of Patent: Nov. 2, 2021

(54) PLATE SPRING-TYPE CONNECTING PIN

(71) Applicant: Sangyang Pak, Cheongju-si (KR)

(72) Inventor: Sangyang Pak, Cheongju-si (KR)

( * ) Notice: Subject to any disclaimer, the term of this patent is extended or adjusted under 35 U.S.C. 154(b) by 0 days.

(21) Appl. No.: 17/040,727

(22) PCT Filed: Apr. 23, 2019

(86) PCT No.: PCT/KR2019/004872
§ 371 (c)(1),
(2) Date: Sep. 23, 2020

(87) PCT Pub. No.: WO2019/245153
PCT Pub. Date: Dec. 26, 2019

(65) Prior Publication Data
US 2021/0003610 A1    Jan. 7, 2021

(30) Foreign Application Priority Data

Jun. 18, 2018  (KR) .................. 10-2018-0069488

(51) Int. Cl.
*G01R 1/067* (2006.01)
*G01R 3/00* (2006.01)
*G01R 31/28* (2006.01)

(52) U.S. Cl.
CPC ..... *G01R 1/06722* (2013.01); *G01R 1/06733* (2013.01); *G01R 3/00* (2013.01); *G01R 31/2886* (2013.01)

(58) Field of Classification Search
CPC .................. G01R 1/06727; G01R 1/07378
See application file for complete search history.

(56) References Cited

U.S. PATENT DOCUMENTS

| 2002/0053468 | A1* | 5/2002 | Yumi | H05K 1/0215 174/261 |
| 2005/0020098 | A1 | 1/2005 | Ramey et al. | |
| 2010/0285698 | A1* | 11/2010 | Lee | G01R 1/06722 439/786 |
| 2012/0202390 | A1 | 8/2012 | Park | |

(Continued)

FOREIGN PATENT DOCUMENTS

| JP | 06208876 A | 7/1994 |
| KR | 1020110004818 A | 1/2011 |

(Continued)

*Primary Examiner* — Paresh Patel
(74) *Attorney, Agent, or Firm* — Rabin & Berdo, P.C.

(57) ABSTRACT

A plate spring-type connection pin is proposed. The connection pin includes: a support pin that has a bending lip portion at an upper portion thereof and a base portion at a lower portion thereof, and is vertically elongated; a plate spring that has an upper probe portion vertically extending adjacent to the lip portion, a lower probe portion disposed at the same height as the base portion, a laterally lying V-shaped portion disposed between the upper probe portion and the lower probe portion, an upper bending portion connecting an upper end of the V-shaped portion and a lower end of the upper probe portion, and a lower bending portion connecting a lower end of the V-shaped portion and an upper end of the lower probe portion; and a bridge that is disposed between the base portion of the support pin and the lower probe portion of the plate spring.

20 Claims, 12 Drawing Sheets

(56) References Cited

U.S. PATENT DOCUMENTS

| | | | | |
|---|---|---|---|---|
| 2014/0273553 A1* | 9/2014 | Heppner | ............... | H01R 43/205 |
| | | | | 439/66 |
| 2014/0361801 A1* | 12/2014 | Pak | ........................... | G01R 3/00 |
| | | | | 324/755.05 |
| 2018/0309211 A1* | 10/2018 | Ju | ........................ | H05K 7/1061 |
| 2018/0348256 A1* | 12/2018 | Hwang | ............... | G01R 31/2886 |
| 2021/0231706 A1* | 7/2021 | Pak | .................... | G01R 1/06722 |

FOREIGN PATENT DOCUMENTS

| KR | 1020110012604 A | 2/2011 |
|---|---|---|
| KR | 1020110036901 A | 4/2011 |

\* cited by examiner

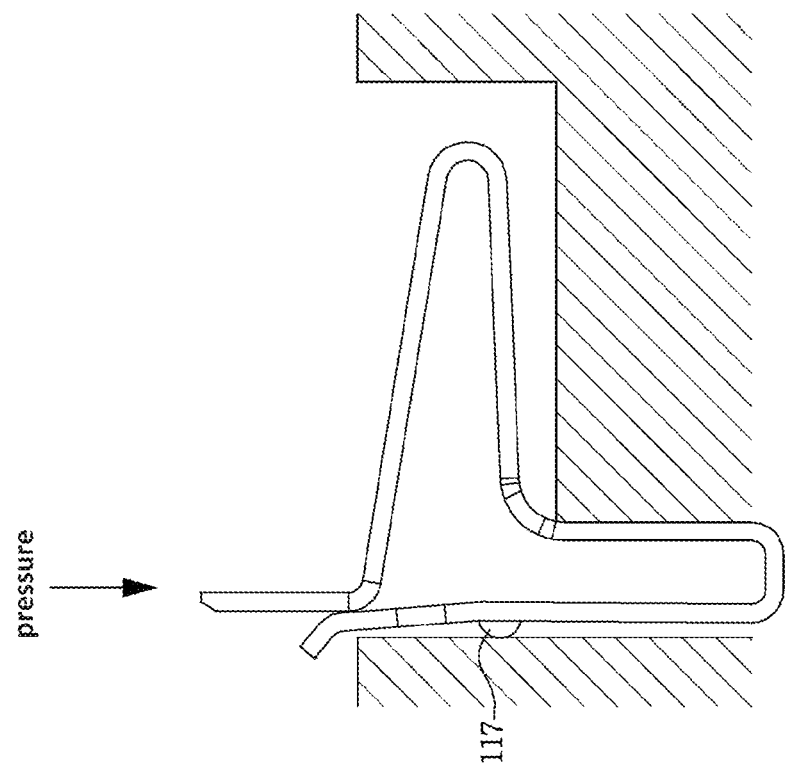
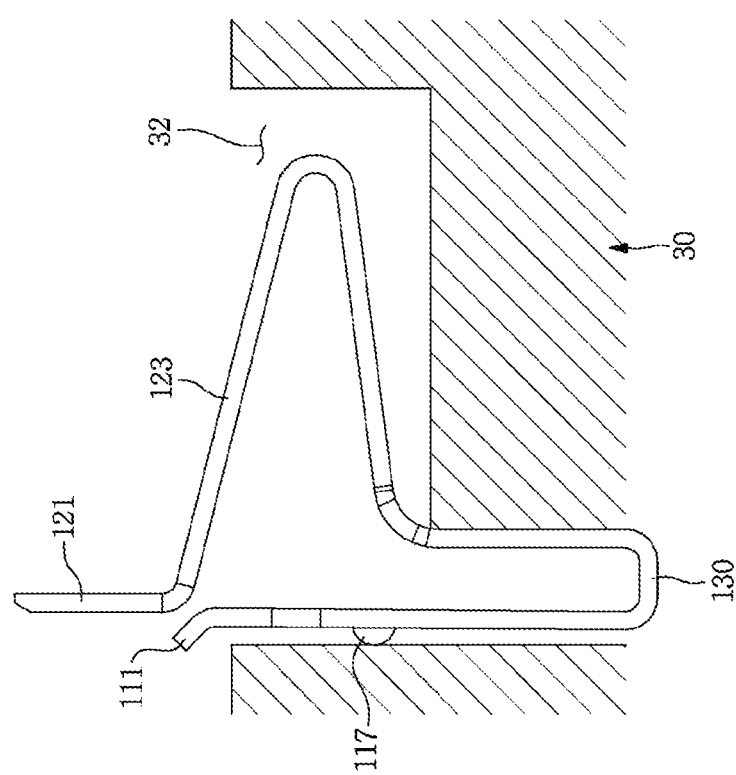
FIG. 12a
FIG. 12b

PLATE SPRING-TYPE CONNECTING PIN

TECHNICAL FIELD

The present invention relates to a plate spring-type connection pin and, particularly, to a integrated plate spring-type connection pin.

BACKGROUND ART

In general, a connection pin is a part that is generally used for not only inspection equipment of a semiconductor wafer, an LCD module, an image sensor, and a semiconductor package, but also various sockets, and the battery connector of a mobile phone.

FIG. 1 is a cross-sectional view schematically showing a connection pin 6 according to the related art. The connection pin 6 includes: a metallic upper probe 2 configured to come in contact with an external terminal of an objective inspection element (e.g., a semiconductor package); a metallic lower probe 13 configured to come in contact with a contact pad of a test board; a coil spring 14 disposed between the upper probe 12 and the lower probe 13 and helping elastic contact of the probes; and a cylindrical pin body 11 accommodating the lower end of the upper probe 12, the upper end of the lower probe 13, and the coil spring 14.

FIG. 2 is a cross-sectional view schematically showing a socket 30 for a semiconductor which accommodates several connection pins 6 helping electrical connection between external terminals 3a of a semiconductor device 3 and contact pads 5a (e.g., a metal wire) of the board 5. As shown in the figure, in the socket 30 for a semiconductor, several connection pins 6 may be arranged with predetermined gaps in an insulating body 1 to be protected from deformation or external physical shock.

In inspection, the upper probe 12 comes in contact with the external terminals 3a of the semiconductor device 3 and the lower probe 13 comes in contact with the contact pads 5a of the board 5, and the upper probe 12 and the lower probe 13 are elastically supported by the coil springs 14 in the connection pins 6, whereby the semiconductor device 3 and the board 5 can be electrically connected and the semiconductor package can be accurately mounted or inspected.

As semiconductor packages are increasingly downsized, integrated, and increased in performance, it is required to reduce the size of connection pins 6 for a semiconductor package. In detail, the smaller the distances between the external terminals 3a of the semiconductor device 3, the smaller the outer diameters of the connection pins 6 should be. Further, in order to minimize the electrical resistance between the semiconductor package and the board, it is required to minimize the length of the connection pins 6 and reduce the thickness of the insulating body 1 supporting the connection pins.

According to connection pins having a dense structure, there is a problem that it is required to keep the electrical contact state between the upper probe and the lower probe and keep the coupling state between the connection pins and the insulating body, and it is difficult to secure a sufficient movement distance within the elasticity limit range.

DISCLOSURE

Technical Problem

The present invention has been made in an effort to solve the problems described above and an objective of the present invention is to provide a plate spring-type connection pin that provides elasticity to be able to secure a maximum movement distance of a probe portion to be able to be applied to a high-integration and/or high-performance field.

Further, the present invention may provide a connection pin that is designed in an integrated structure and can minimize a loss of electrical signal and improve a signal quality by maximally shortening a signal path between an upper probe portion and a lower probe portion and minimizing electrical resistance.

Further, the present invention is configured not only to easily manufacture a connection pin that is structurally simplified and integrated, but also to be able to improve durability.

Technical Solution

In order to achieve the objectives, a plate spring-type connection pin according to the present invention includes: a support pin that has a bending lip portion at an upper portion thereof and a base portion at a lower portion thereof, and is vertically elongated; a plate spring that has an upper probe portion vertically extending adjacent to the lip portion, a lower probe portion disposed at the same height as the base portion, a laterally lying V-shaped portion disposed between the upper probe portion and the lower probe portion, an upper bending portion connecting an upper end of the V-shaped portion and a lower end of the upper probe portion, and a lower bending portion connecting a lower end of the V-shaped portion and an upper end of the lower probe portion, and that is disposed at a predetermined distance from the support pin; and a bridge that is disposed between the base portion of the support pin and the lower probe portion of the plate spring. The upper probe portion of the plate spring may be reciprocated up and down by elasticity of the V-shaped portion.

Further, a plate spring-type connection pin according to another aspect of the present invention includes: a support pin that has a bending lip portion at an upper portion thereof and a first base portion at a lower portion thereof, and is vertically elongated; a plate spring that has an upper probe portion vertically extending adjacent to the lip portion, a second base portion disposed at the same height as the first base portion, a laterally lying V-shaped portion disposed between the upper probe portion and the second base portion, an upper bending portion connecting an upper end of the V-shaped portion and a lower end of the upper probe portion, and a lower bending portion connecting a lower end of the V-shaped portion and an upper end of the second base portion, and that is disposed at a predetermined distance from the support pin; and a bridge that is disposed between the first base portion of the support pin and the second base portion of the plate spring, in which the bridge may bend from a lower end of the first base portion and a lower end of the second base portion, thereby connecting the first base portion and the second base portion and functioning as a lower probe.

In an embodiment of the present invention, when the connection pin according to the present invention is mounted in a pin hole of a housing and then the upper probe portion is vertically moved down, an inner surface of the upper probe portion may be disposed to be able to come in contact with an inner surface of the lip portion.

Selectively, the V-shaped portion may have a first inclined portion tapered upward, a second inclined portion tapered downward, and a bending portion connecting the first inclined portion and the second inclined portion to each other to be elastically supported.

According to the present invention, as described above, the length of the first inclined portion may be larger than the length of the second inclined portion to secure contact between the upper probe portion and the lip portion and provide a gap between the base portion and the lower probe portion.

In an embodiment of the present invention, the width of the bending portion may be larger than the width of the upper bending portion and the width of the lower bending portion.

According to the present invention, the plate spring may be made of a metal plate member having a rectangular cross-section on the basis of the strain of a cantilever.

In addition, according to the present invention, the lower probe portion is disposed in a direction having an inclination angle with respect to the support pin vertically extending, whereby the connection pin according to the present invention can be firmly fixed in the pin hole of the housing by elasticity of the lower probe portion.

In the present invention, the plate spring may further have an extension portion bending from a lower end of the lower probe portion to the base portion, and the length of the extension portion is smaller than the length of the bridge.

Further, the support pin may have a pair of locking steps protruding in a width direction from both edges.

In particular, according to the present invention, the support pin, the plate spring, and the bridge may be an integrally connected single part.

The features and advantages of the present invention will be made further clear by the following description based on the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Advantageous Effects

According to the present invention, it is possible to an integrated plate spring-type connection pin that can reduce a signal path and improve a signal quality.

The present invention is designed in a structure that minimizes the length of a connection pin to minimize electrical resistance in an electrical path.

In particular, the present invention can sufficiently secure an up-down movement height of the upper probe portion of the connection pin by reducing the size and providing a sufficiently elastic restoring force through the V-shaped portion.

According to the present invention, since the support pin, the plate spring, and the bridge are formed as a single part, mass production is possible and an effect of reducing the manufacturing cost can be expected by simplifying and unifying the manufacturing process.

The plate spring-type connection pin according to an aspect of the present invention has an advantage that soldering for attaching a solder ball to the lower end of the connection pin is easier because there is no lower opening.

The plate spring-type connection pin according to an aspect of the present invention has an advantage that the possibility of damage to a punch and a die decreases and mass production is easy because there is no work for cutting off a small space during the manufacturing process.

DESCRIPTION OF DRAWINGS

FIG. 12a is a side view schematically showing a pre-compression state of the connection pin according to the third embodiment of the present invention, and FIG. 12b is a side view schematically showing a post-compression state of the connection pin according to the third embodiment of the present invention.

BEST MODE

Figure 1:
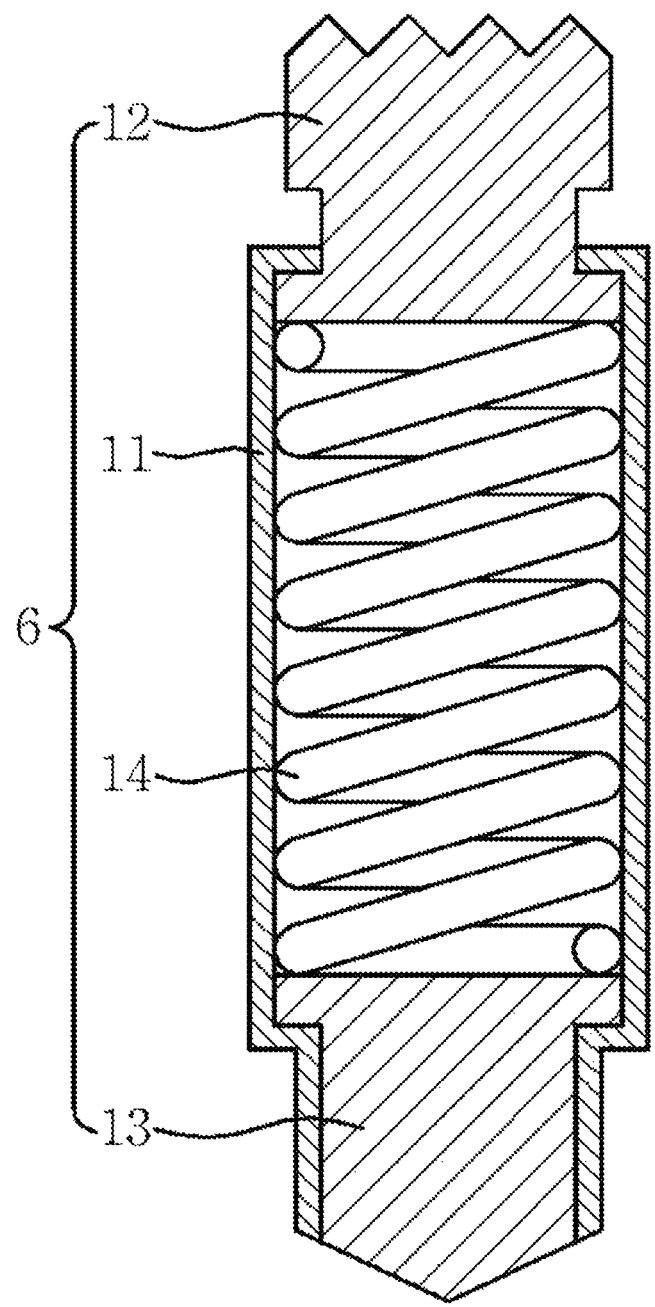
FIG. 1 is a cross-sectional view schematically showing a connection pin according to the related art.
Figure 2:
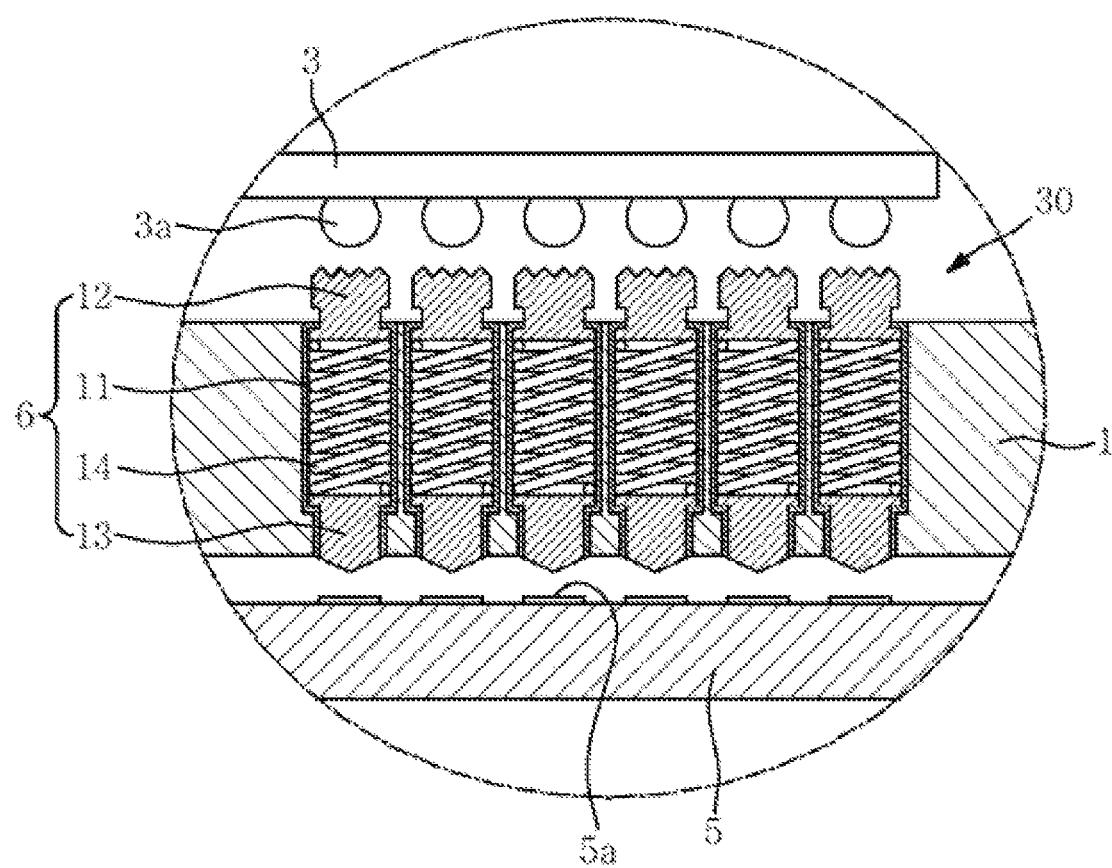
FIG. 2 is a cross-sectional view schematically showing a socket for semiconductor package inspection in which the connection pins shown in FIG. 1 are arranged.

The objectives, specific features, and new features of the present invention will be more apparent from the following detailed description and embodiments relating to the accompanying drawings. It should be noticed that when reference numerals are given to components in the drawings in the specification, the same components are given the same number even if they are not shown in different drawings. Further, in describing the present invention, detailed descriptions of well-known technologies will be omitted so as not to obscure the description of the present invention with unnecessary detail. In the specification, terms 'first', 'second', etc. are used to discriminate one component from another component and the components are not limited to the terms. In the accompanying drawings, some components may be exaggerated, omitted, or schematically shown, and the sizes of the components do not fully reflect the actual sizes.

Hereinafter, embodiments of the present invention are described in detail with reference to the accompanying drawings.

Figure 3:
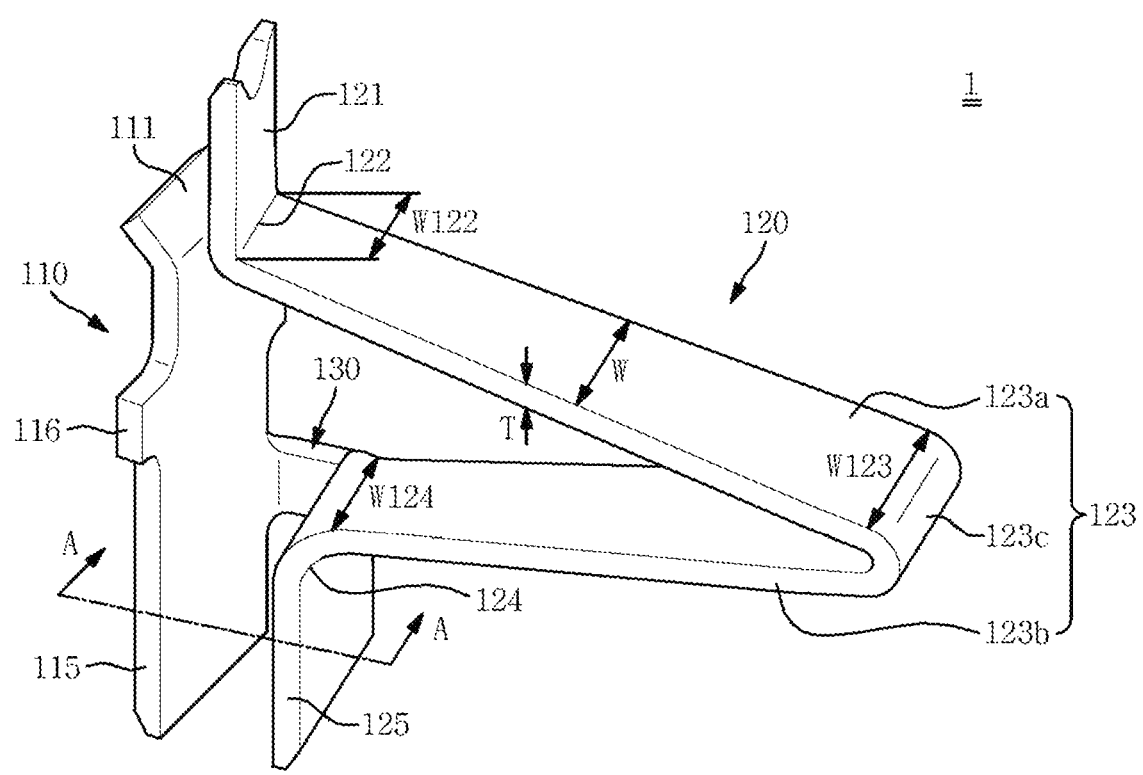
FIG. 3 is a perspective view schematically showing a plate spring-type connection pin according to a first embodiment of the present invention.
Figure 4:
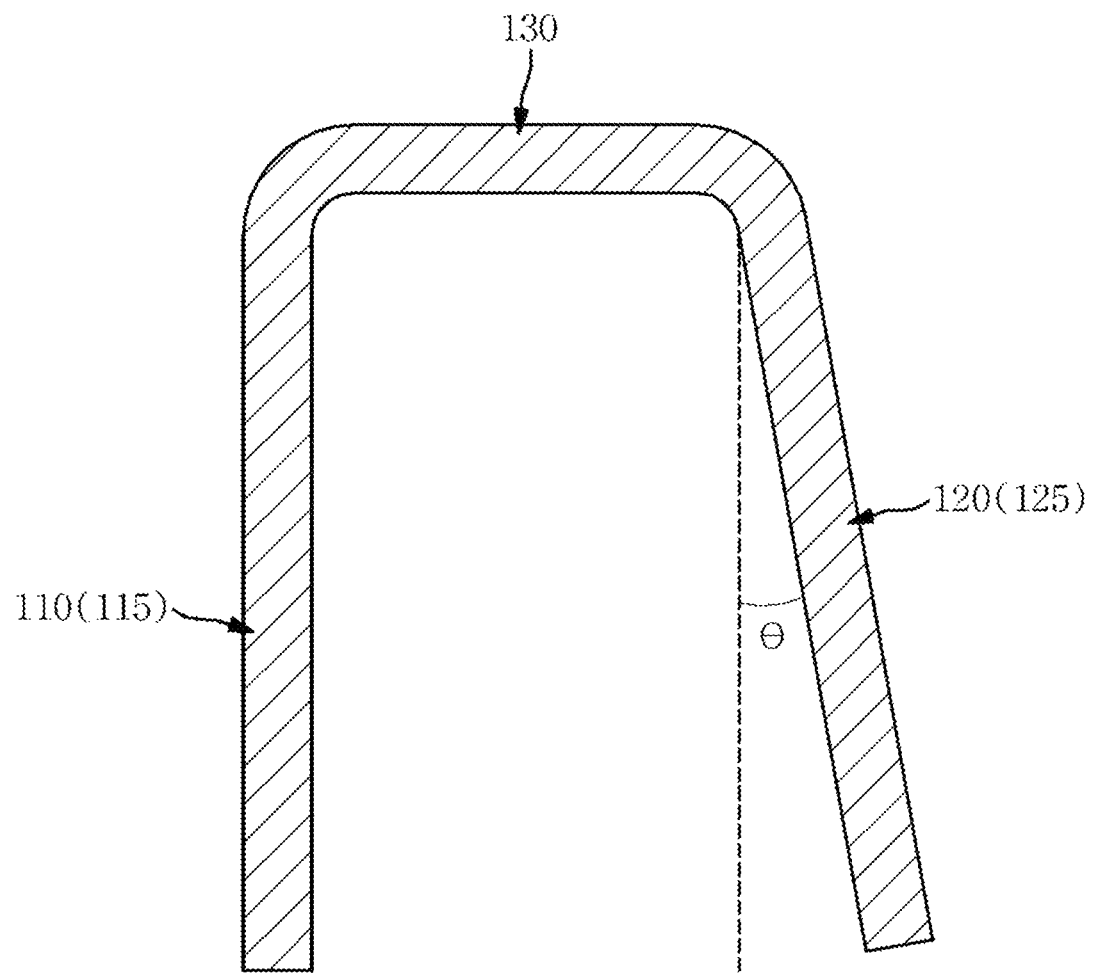
FIG. 4 is a horizontal cross-sectional view taken along line A-A of FIG. 3.
Figure 5:
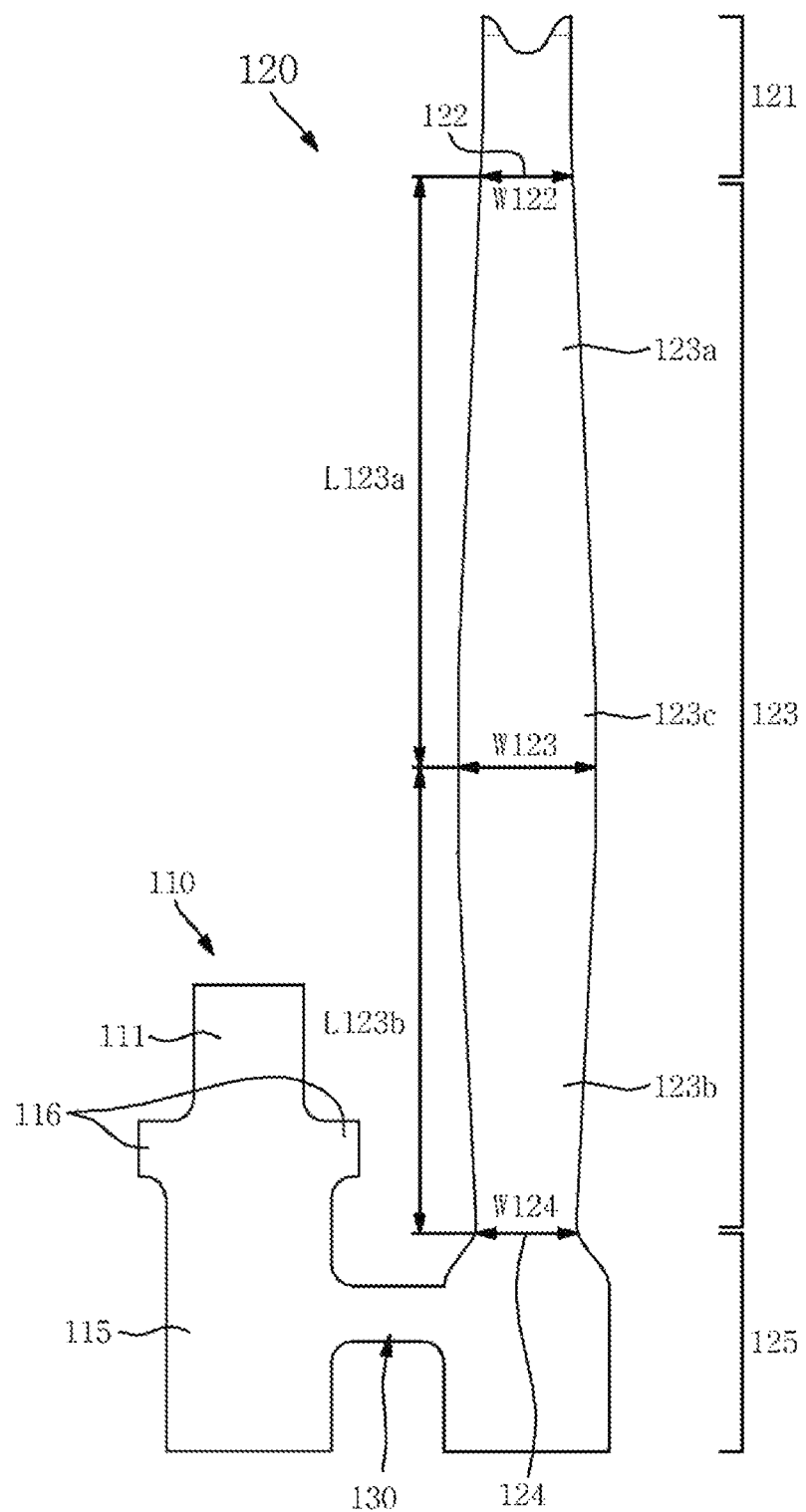
FIG. 5 is a development view schematically showing the plate spring-type connection pin according to the first embodiment of the present invention.

Referring to FIGS. 3 to 5, a plate spring-type connection pin 1 according to a first embodiment of the present invention is a contact for an electric device which is vertically inserted in a pin hole of a housing and connects, for example, an external terminal (or a lead) of a semiconductor package and a pattern of a printed circuit board (hereafter, PCB). The connection pin 1 has an upper probe portion 121 and a lower probe portion 125, which protrude outward from the top and the bottom of a housing disposed between a semiconductor package and a PCB, and is configured to secure reliable electrical connection through elastic deformation of a plate spring 120 due to a contact force when coming in contact with an external terminal of the semiconductor package and a pattern of the PCB so that an electrical signal can be transmitted stably without distortion.

The plate spring-type connection pin 1 according to an embodiment of the present invention includes: a support pin 110 vertically elongated the formation direction (axial direction) of a pin hole on the inner surface of the pin hole; a plate spring 120 disposed at a predetermined distance from the support pin 110 and bent in the pin hole; and a bridge 130 disposed between the support pin 110 and the plate spring 120.

Preferably, in the plate spring-type connection pin 1 according to the present invention, the support pin 110, the plate spring 120, and the bridge 130 may be formed in a single metal plate. The connection pin 1 according to the present invention may be formed in the shape shown in FIG. 3, for example, by punching a metal plate having high electrical conductivity, as shown in FIG. 5, and then bending a cut integrated connection pin.

The support pin 110 vertically extends to be able to be supported in the pin hole, as described above. The support pin 110 has a lip portion 111 having a small width at the upper portion thereof, a base portion 115 having a large width and vertically extending straight from the lower portion of the lip portion, and a pair of locking steps 116 protruding in the width direction from both edges between the lip portion 111 and the base portion 115.

In detail, the lip portion 111 is inclined at a predetermined angle from the longitudinal direction of the support pin 110, that is, is bent away from the upper probe portion 121 of the plate spring 120. Selectively, only a portion of the upper end of the lip portion 111 may be bent at a predetermined angle, as described above. Since a portion of the lip portion 111 is bent, as described above, and has elasticity by bending backward, the lip portion 111 can make good electrical contact with the upper probe portion 121 of the plate spring 120 that contracts downward.

The base portion 115 is vertically inserted in the pin hole 31 and supported in a bottom opening of the pin hole 31. The lower end of the base portion may protrude downward from the housing 30 and may electrically come in contact with, for example, a PCB.

The locking steps 116 help fix the position of the support pin 110 by being fitted inside the housing 30. The pin hole 31 of the housing 30 is narrowed with a step at the portion corresponding to the bottom of the lower ends of the locking steps 116 to be able to lock the lower end of the locking steps 116.

As shown in the figures, the plate spring 120 is formed in a thin and long band shape and may be disposed in parallel with the support pin 110 with a predetermined gap therebetween. As shown in FIG. 3, the support pin 110 and the plate spring 120 may be spaced apart from each other with a predetermined gap therebetween by the bridge 130 even after they are bent. The plate spring 120 is formed by bending a thin and long band at several points to perform the function of a plate spring, whereby it is configured to be able to be contracted by being pressed by an external component, for example, an external terminal of a semiconductor package. The width W of the plate spring 120 is larger than the thickness T thereof and the plate spring 120 is bent such that a bending line is formed in the width direction.

The band-shaped plate spring 120 may have an upper probe portion 121, an upper bending portion 122, a V-shaped portion 123, a lower bending portion 124, and a lower probe portion 125, which are sequentially disposed. The plate spring 120 has a structure in which the laterally lying V-shaped portion 123 is disposed between the upper bending portion 122 and the lower bending portion 124 and the upper probe portion 121 can be reciprocated up and down by the elasticity of the V-shaped portion to be elastically come in contact with each probe portion.

The upper probe portion 121 vertically protrudes upward from the housing 30 and, and for example, may have a shape that can secure good electrical contact with an external terminal of a semiconductor package disposed thereunder. That is, the upper probe portion 300 may provide various shapes such as a mountain shape, a crown shape, a cone shape, and a flat tip shape. The upper probe portion 121, as described above, can be reciprocated up and down in a top opening of the pin hole of the housing by the V-shaped portion 123.

Further, the lower probe portion 125 protrudes vertically downward from the housing 30, similar to the base portion 115 of the support pin 110, and for example, may electrically come in contact with a PCB disposed thereunder.

As described above, the V-shaped portion 123 is disposed between the upper probe portion 121 and the lower probe portion 125 in the plate spring 120, in which the upper end of the laterally lying V-shaped portion 123 and the lower end of the upper probe portion 121 are connected through the upper bending portion 122, and the lower end of the laterally lying V-shaped portion 123 and the upper end of the lower probe portion 125 are connected through the lower bending portion 124.

Preferably, the V-shaped portion 123 has a first inclined portion 123a tapered upward, a second inclined portion 123b tapered downward, and a bending portion 123c elastically connecting the first inclined portion 123a and the second inclined portion 123b. The bending portion 123c integrally connects the lower end of the first inclined portion 123a and the upper end of the second inclined portion 123b, thereby being able to provide elasticity such that gap between the upper end of the first inclined portion 123a and the lower end of the second inclined portion 123b can be changed. The elasticity of the V-shaped portion elastically supports the upper probe portion and the lower probe portion, thereby securing reliable electrical contact with an external component. For reference, the interior angle of the bending portion 123c is an acute angle.

Further, the length L123a of the first inclined portion 123a is made larger than the length L123b of the second inclined portion 123b in the V-shaped portion 123 such that the upper end of the V-shaped portion 123, that is, the inner surface of the upper probe portion 121 is disposed on the same vertical line to be close to the inner surface of the lip portion 111, which provides a structure in which the upper probe portion 121 can come in contact with the inner surface of the lip portion 111 when being moved down by an external force.

Further, in the plate spring 120, the width W123 of the bending portion 123c is made larger than the width W122 of the upper bending portion 122 and the width W124 of the lower bending portion 124. When an external force is applied through the upper probe portion 121 and the plate spring 120 contracts, maximum stress is usually generated at the bending portion 123c, so the bending portion 123 is formed wider than other portions, thereby being able to effectively distribute the stress and keep smooth bending deformation of the V-shaped portion. Obviously, since the width W122 of the upper bending portion 122 and the width W124 of the lower bending portion 124 are relatively small, a plate member can be easily bent to be vertically arranged.

Further, the plate spring 120 may be made of a metal plate having a rectangular cross-sectional shape having cross-sectional width W and thickness at a predetermined point. The maximum elastic displacement of a cantilever having a rectangular cross-sectional shape is in proportion to the cross-sectional width and in inverse proportion to the cube of the thickness. In other words, when the thickness of a plate spring having a rectangular cross-sectional shape is reduced half, the displacement increases 8 times under the same external force. According to the present invention, the width W can be made larger than the thickness T, so it is possible to maximize the maximum elastic deformation of the V-shaped portion and provide elasticity.

In the plate spring-type connection pin 1 according to an embodiment of the present invention, the bridge 130 is disposed between the support pin 110 and the plate spring 120, so the support pin 110 and the plate spring 120 can be spaced with a predetermined gap, and the support pin 110 and the plate spring 120 can be electrically connected. In detail, the bridge 130 may be disposed between one surface of the base portion 115 of the support pin 110 and another surface of the lower probe portion 125 of the plate spring 120, under the lower bending portion 124. Accordingly, the lower probe portion 125 disposed straight under the lower bending portion can be easily bent vertically in the same direction as the base portion 115.

Further, according to the present invention, the base portion 115 and the lower probe portion 125 are disposed at the same height, and before the connection pin is mounted in a housing, the plate spring 120, particularly, the lower probe portion 125 is inclined at an inclination angle θ from the support pin 110 without the base portion and the lower probe portion facing each other in parallel with each other. That is, the lower probe portion 125 is bent such that the farther the entire lower probe portion 125 horizontally from the bridge 130, the larger the gap from the base portion 115.

Further, in the plate spring-type connection pin 1 according to an embodiment of the present invention, the upper probe portion 121 vertically extending is disposed over the lip portion 111 of the support pin 110, and a gap is formed between the upper probe portion 121 and the lip portion 111 before an external force is applied. Further, the outer surface of the connection pin 1 is plated to decrease electrical resistance and improve anticorrosion and a predetermined gap is maintained between the lip portion 111 and the upper probe portion 121 in a free state such that plating is possible.

As described above, since a gap is defined between the upper probe portion and the lip portion, plating can be effectively performed.

Figure 6A:
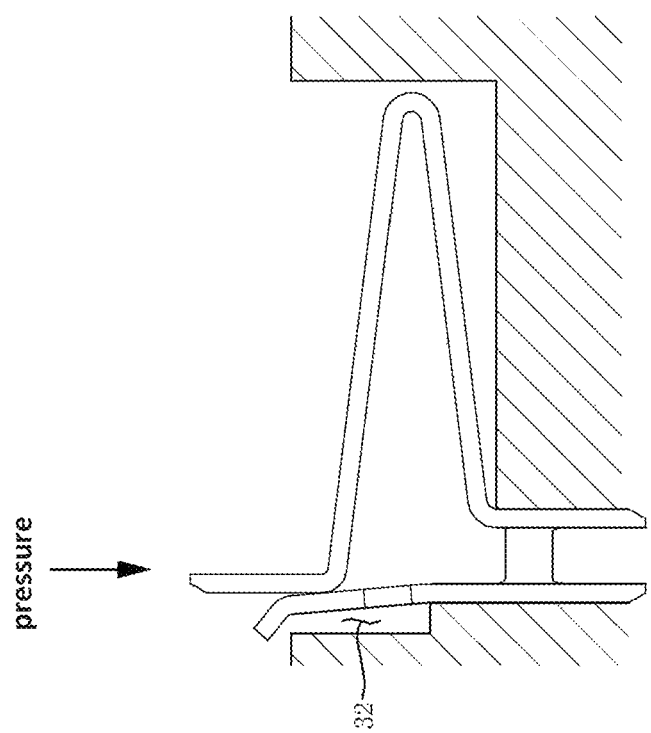
FIG. 6a is a side view schematically showing a pre-compression state of the connection pin according to a first embodiment of the present invention.
Figure 6B:
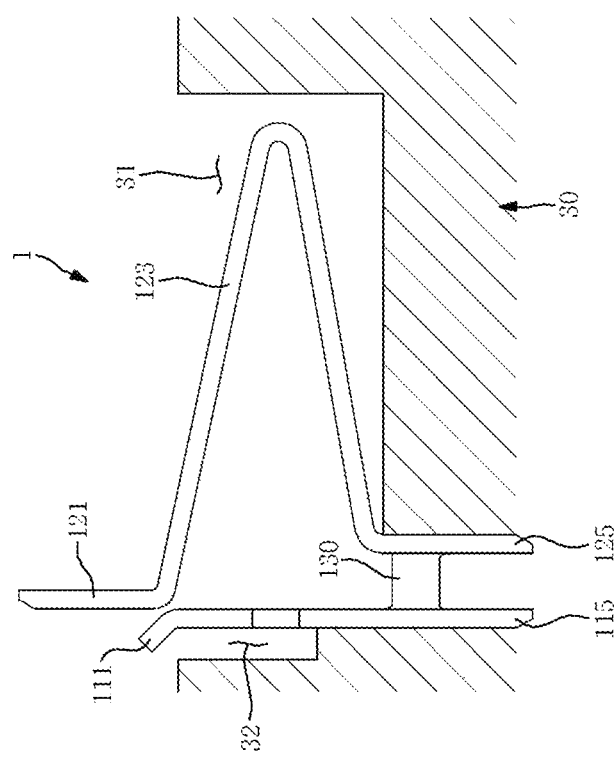
FIG. 6b is a side view schematically showing a post-compression state of the connection pin according to a first embodiment of the present invention.

FIGS. 6a and 6b are views from which it is possible to see the fastening state of the plate spring-type connection pin 1 according to the present invention and a housing 30. Connection pins may be arranged with predetermined intervals respectively in several pin holes 31 formed in the thickness direction in an insulating body of a housing 30 so that the connection pins can be protected from deformation or external physical shock.

FIG. 6a shows a connection pin 1 inserted in a pin hole 31 of a housing 30 made of an insulating material, which is a side view showing the state before an external force is applied from above to the upper probe portion 121 of a plate spring.

When the connection pin 1 according to the present invention is disposed in the bottom opening of the pin hole 31, the lower probe portion 125, which is open at the inclination angle θ, of the plate spring is compressed to be parallel with the base portion 115, whereby the connection pin 1 can be firmly fixed in the bottom opening of the pin hole 31. The lower end of the base portion 115 or the lower end of the lower probe portion 125 of the connection pin 1 according to the present invention protrudes outward, so, for example, it can be electrically brought in contact with a PCB. As shown in the figures, the lower end of the base portion 115 and the lower end of the lower probe portion 125 of the connection pin 1 according to the present invention are aligned at the same level, so it is possible to maintain a reliable contact state with the PCB. In this state, the lower probe portion 125 presses the inner surface of the pin hole by means of the elastic restoring force, so it can be supported on the inner surface of the bottom opening of the pin hole.

According to this structure, the cross-section of the lower end of the pin hole 31 of the housing 30 can be formed relatively large, for example, in the size of about 0.2 mm×0.2 mm through injection molding. The cross-section defined by the base portion 115, the bridge 130, and the lower probe portion 125 is a square or a rectangle close to a square and it is relatively easy to form a hole, which can accommodate this structure, in an injection-molded part.

For example, it is very difficult to form a slit-shaped through hole of 0.2 mm×0.04 mm in the housing 30 through injection molding.

According to the present invention, the base portion 115, the bridge 130, and the lower probe portion 125 form a U-shaped cross-section to make it easier to form the pin hole 31 in the housing 30.

Further, an advantage that it is possible to reliably maintain the coupling state of the housing 30 and the connection pin. Since the base portion 115, the bridge 130, and the lower probe portion 125 form a U-shaped cross-section and the opening force between the base portion 115 and the lower probe portion 125 presses the inside of the pin hole, whereby the connection pin 1 is not separated from the housing 30 even if the assembly of the connection pin 1 and the housing 30 is moved or turned over during or after the manufacturing process.

The housing 30 has a space portion 32 that provides a space in which the lip portion 111 can be bent backward when the upper probe portion 121 is moved down in contact with the lip portion 111 in the housing 30.

FIG. 6b shows the state in which the upper probe portion 121 has been moved down by compressing and contract the V-shaped portion 123 by applying an external force to the upper probe portion 121 of the integrated plate spring-type connection pin 1 according to the present invention inserted in the pin hole 31 of the housing 30, for example, through a semiconductor package disposed on the upper probe portion. When the connection pin 1 of the present invention is pressed and the V-shaped portion 123 is contracted, the V-shaped portion can be effectively elastically deformed by bending of the bending of the bending portion 123c (see FIG. 3) of the V-shaped portion.

That is, according to the present invention, as described above, when, for example, an external terminal of a semiconductor package strongly comes in contact with the upper probe portion 121, an elastic restoring force can be provided. When an external force is applied to the upper probe portion 121, the V-shaped portion 123 is compressed and the upper probe portion 121 can come in contact with the lip portion 111 by moving down in the pin hole 31. When the external force is removed, the upper probe portion 30 is returned to the initial position by the elastic restoring force of the V-shaped portion 123.

When the upper probe portion 121 moves down and comes in contact with the lip portion 111, a shortest path of an electrical signal can be provided in the connection pin 1 of the present invention, and the cross-section of an electrical path is increased, thereby being able to reduce loss of an electrical signal.

Figure 7:
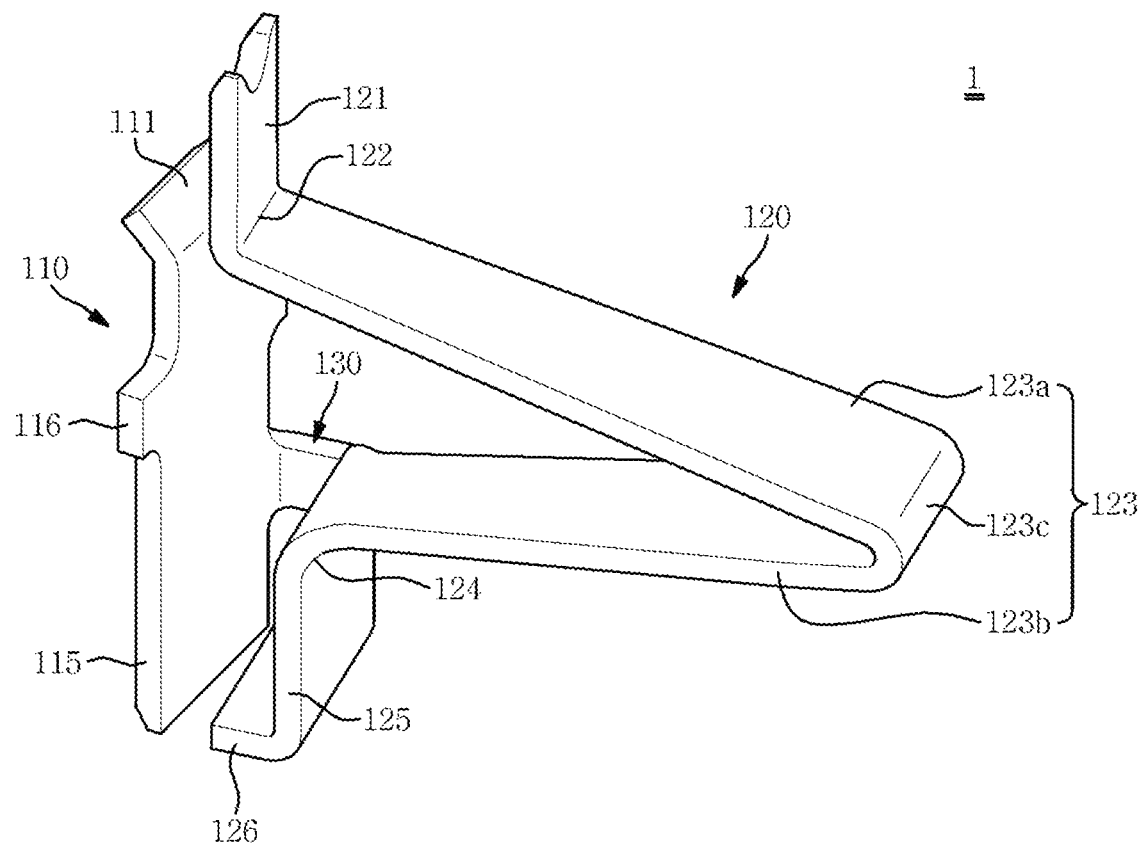
FIG. 7 is a perspective view schematically showing a plate spring-type connection pin according to a second embodiment of the present invention.
Figure 8:
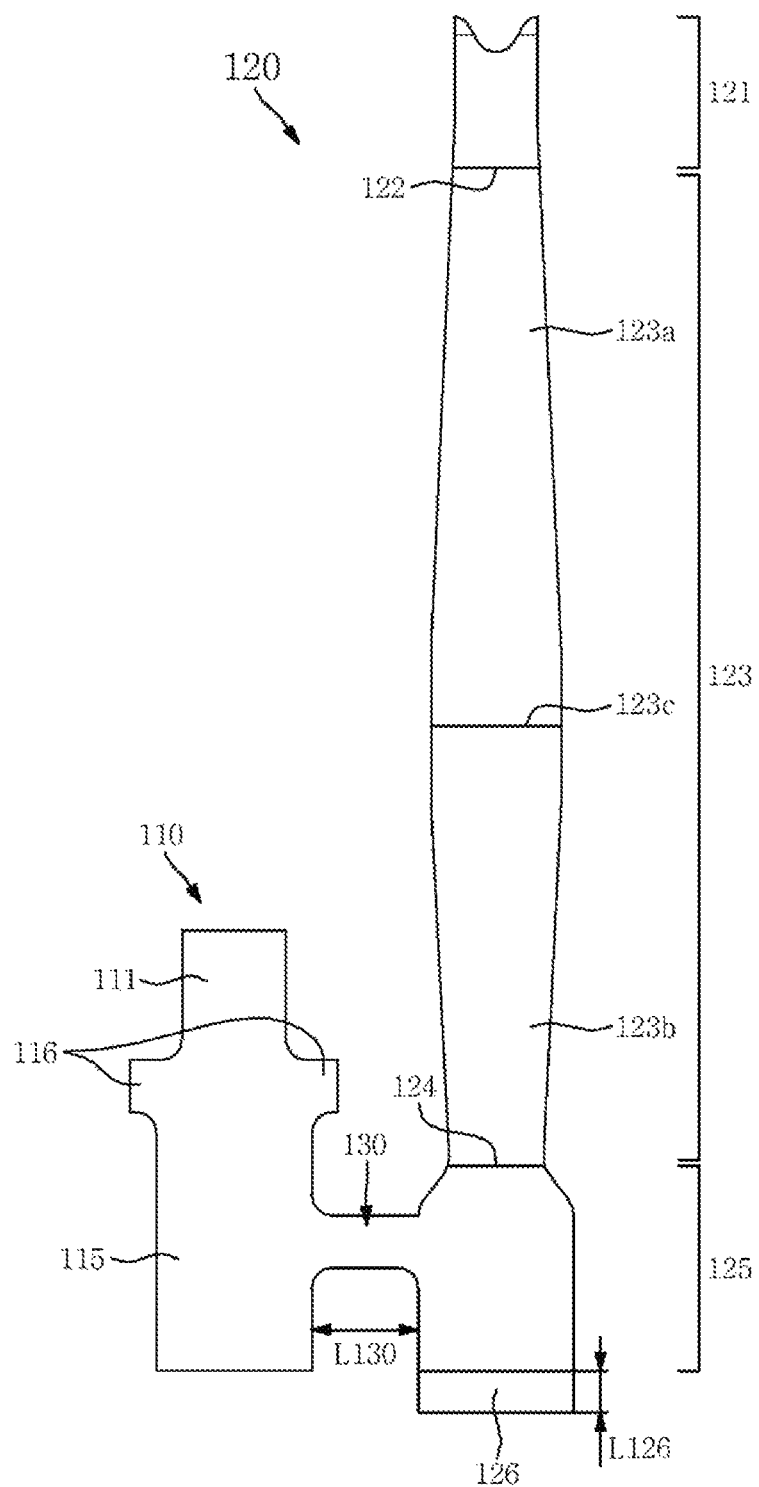
FIG. 8 is a development view schematically showing the plate spring-type connection pin according to the second embodiment of the present invention.
Figure 9A:
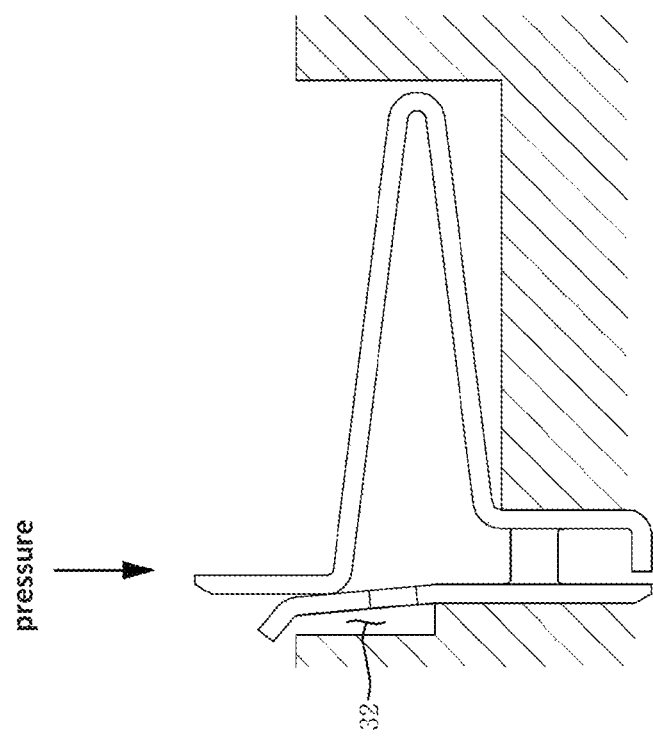
FIG. 9a is a side view schematically showing a pre-compression state of the connection pin according to the second embodiment of the present invention.
Figure 9B:
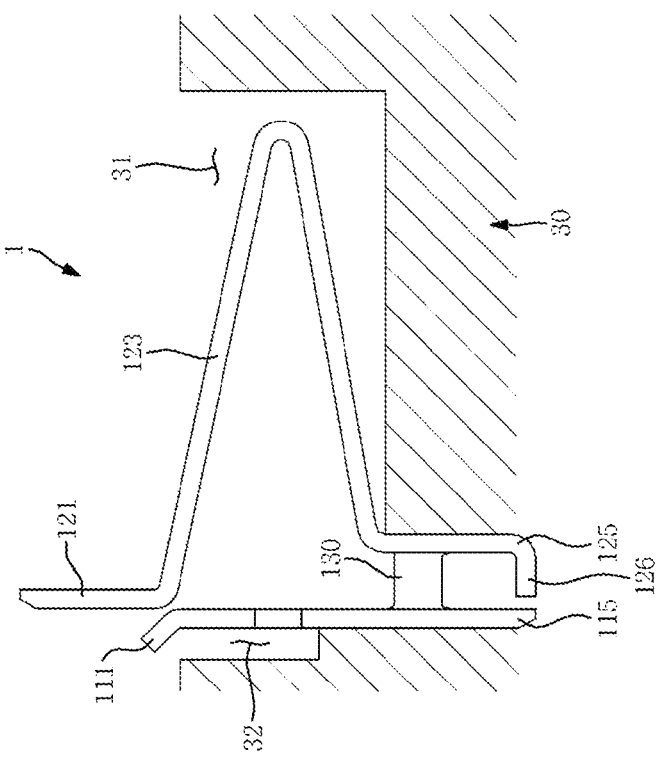
FIG. 9b is a side view schematically showing a post-compression state of the connection pin according to the second embodiment of the present invention.

FIGS. 7 to 9 are views schematically showing a plate spring-type connection pin according to a second embodiment of the present invention. The plate-spring type connection pin shown in FIGS. 7 to 9 is another modification of the plate spring-type connection pin shown in FIGS. 3 to 6 and is very similar in structure, so similar or the same configurations are not described to help clearly understand the present invention.

The plate spring-type connection pin 1 according to the second embodiment of the present invention has: a support pin 110 vertically inserted in a pin hole of a housing and elongated in the through-direction of the pin hole to have elasticity to be able to come in contact with an external component; a plate spring 120 disposed at a predetermined distance from the support pin 110 and bent in the pin hole; and a bridge 130 disposed between the support pin 110 and the plate spring 120.

As shown in the figures, the plate spring 120 has a thin and long band shape composed of an upper probe portion 121, an upper bending portion 122, a V-shaped portion 123, a lower bending portion 124, a lower probe portion 125, and an extension portion 126 elongated downward from the lower probe portion.

In particular, the extension portion 126 horizontally bends toward the base portion 115, thereby increasing the contact area, for example, with wires on a PCB disposed thereunder, and for example, thereby being able to reduce a solder that flows inside along the gap between the base portion 115 and the lower probe portion 125. In the connection pin 1 according to the present invention, the lower end of the base portion 115 and the extension portion 126 are aligned at the same level.

According to the present invention, the length L126 of the extension portion 126 is smaller than or the same as the length L130 of the bridge 130.

Figure 10:
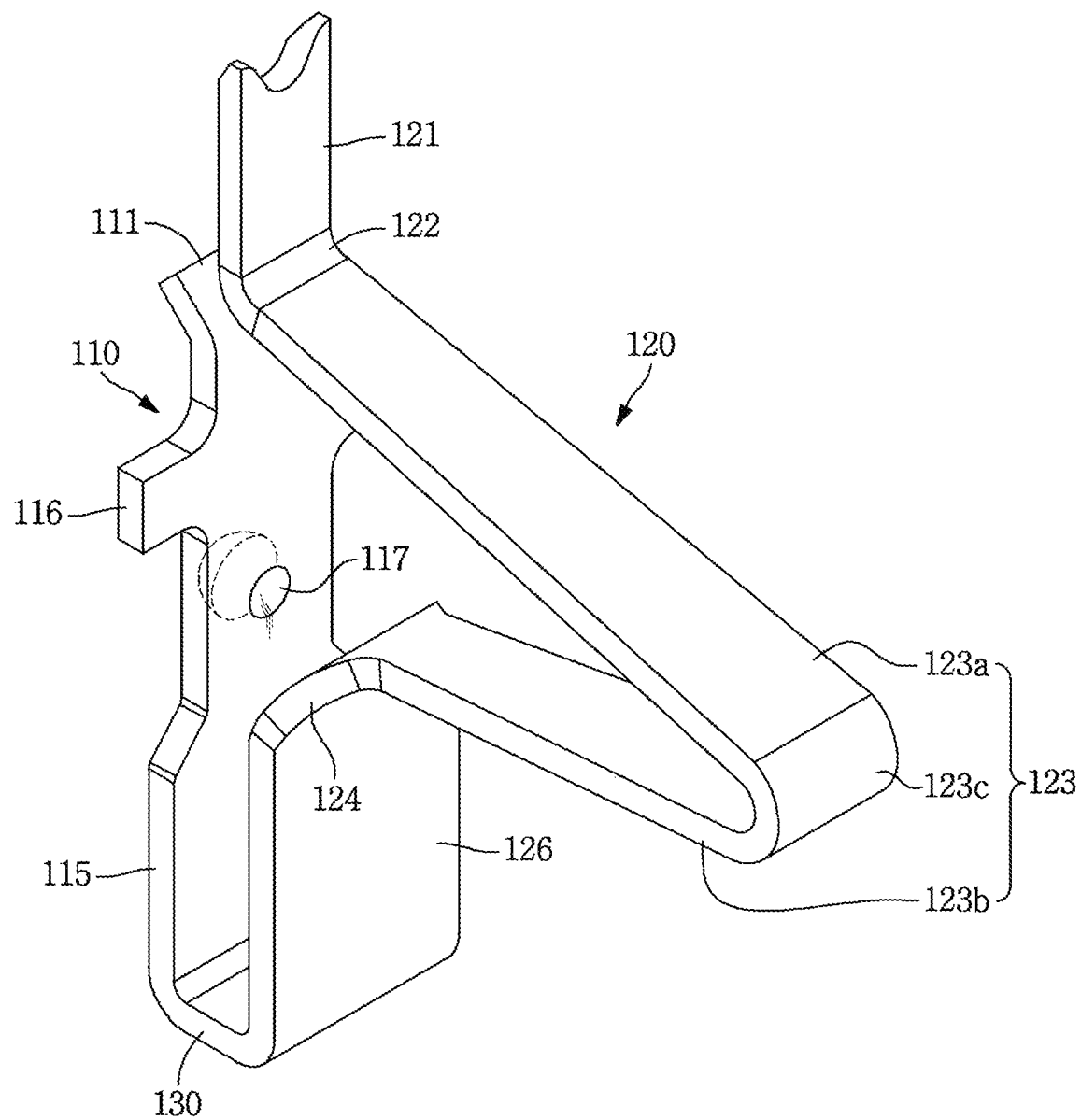
FIG. 10 a perspective view schematically showing a plate spring-type connection pin according to a third embodiment of the present invention.
Figure 11:
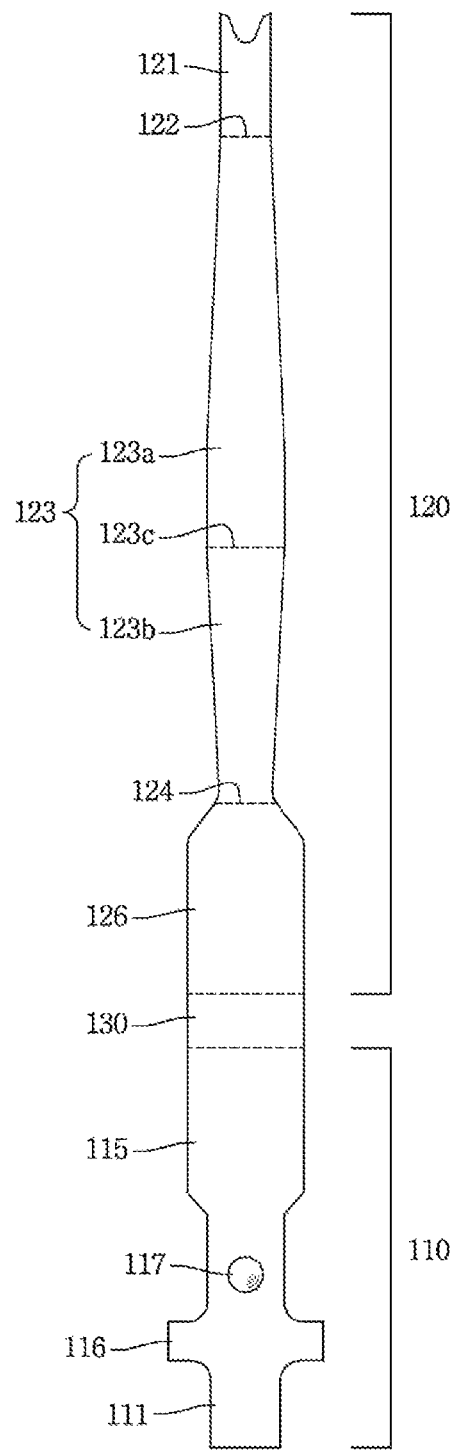
FIG. 11 a development view schematically showing the plate spring-type connection pin according to the third embodiment of the present invention.

FIGS. 10 to 12 are views schematically showing a plate spring-type connection pin according to a third embodiment of the present invention. The plate-spring type connection pin shown in FIGS. 10 to 12 is another modification of the plate spring-type connection pin shown in FIGS. 3 to 6 and is very similar in structure, so similar or the same configurations are not described to help clearly understand the present invention.

Referring to FIGS. 10 to 12, a plate spring-type connection pin according to the third embodiment of the present invention is a contact for an electric device which is vertically inserted in a pin hole 32 of a housing and connects, for example, an external terminal (or a lead) of a semiconductor package and a pattern of a printed circuit board (hereafter, PCB). The connection pin 32 has an upper probe portion 121 and a bridge 230, which protrude outward from the top and the bottom of a housing disposed between a semiconductor package and a PCB, and is configured to secure reliable electrical connection through elastic deformation of a plate spring 120 due to a contact force when coming in contact with an external terminal of the semiconductor package and a pattern of the PCB so that an electrical signal can be transmitted stably without distortion.

The plate spring-type connection pin according to the third embodiment of the present invention includes: a support pin 110 vertically elongated the formation direction (axial direction) of a pin hole on the inner surface of the pin hole; a plate spring 120 disposed at a predetermined distance from the support pin 110 and bent in the pin hole; and a bridge 130 disposed between the support pin 110 and the plate spring 120.

Preferably, in the plate spring-type connection pin according to the present invention, the support pin 110, the plate spring 120, and the bridge 130 may be formed in a single metal plate. The connection pin according to the present invention may be formed in the shape shown in FIG. 10, for example, by punching a metal plate having high electrical conductivity, as shown in FIG. 11, and then bending a cut integrated connection pin.

A first base portion 115 and a second base portion 126 are vertically inserted in the pin hole 32 and supported in a bottom opening of the pin hole 32. The bridge 130 may protrude downward from the housing 30 and may electrically come in contact with, for example, a PCB.

The locking steps 116 help fix the position of the support pin 110 by being fitted inside the housing 30. The pin hole 32 of the housing 30 is narrowed with a step at the portion corresponding to the bottom of the lower ends of the locking steps 116 to be able to lock the lower end of the locking steps 116.

As shown in the figures, the plate spring 120 is formed in a thin and long band shape and may be disposed in parallel with the support pin 110 with a predetermined gap therebetween. As shown in FIG. 10, the support pin 110 and the plate spring 120 may be spaced apart from each other with a predetermined gap therebetween by the bridge 130 even after they are bent. The plate spring 120 is formed by bending a thin and long band at several points to perform the function of a plate spring, whereby it is configured to be able to be contracted by being pressed by an external component, for example, an external terminal of a semiconductor package.

The band-shaped plate spring 120 may have an upper probe portion 121, an upper bending portion 122, a V-shaped portion 123, a lower bending portion 124, and a second probe portion 126, which are sequentially disposed. The plate spring 120 has a structure in which the laterally lying V-shaped portion 123 is disposed between the upper bending portion 122 and the lower bending portion 124 and the upper probe portion 121 can be reciprocated up and down by the elasticity of the V-shaped portion to be elastically come in contact with each probe portion.

The upper probe portion 121 vertically protrudes upward from the housing 30 and is positioned at the upper portion, and for example, may have a shape that can secure good electrical contact with an external terminal of a semiconductor package. That is, the upper probe portion 300 may provide various shapes such as a mountain shape, a crown shape, a cone shape, a flat tip shape. The upper probe portion 121, as described above, can be reciprocated up and down in the opening at the upper end of the pin hole of the housing by the V-shaped portion 123.

The second base portion 126 is disposed at a position corresponding to the first base portion 115 of the support pin 110 and the bridge 130 bends and extends from the lower end of the first base portion 115 and the lower end of the second base portion 126, thereby connecting the base portions and functioning as a lower probe. The bridge 130 protrudes vertically downward in the housing 30, thereby, for example, being able to come in contact with a PCB disposed thereunder.

In the plate spring-type connection pin according to an embodiment of the present invention, the bridge 130 is disposed between the support pin 110 and the plate spring 120, so the support pin 110 and the plate spring 120 can be spaced with a predetermined gap, and the support pin 110 and the plate spring 120 can be electrically connected.

Since the plate spring-type connection pin according to the first embodiment or the second embodiment has a lower opening, a solder solution moves up along the gap during soldering, so it is difficult to attach a solder ball. However, the plate spring-type connection pin according to the third embodiment has not lower opening, so there is an advantage that soldering for attaching a solder ball to the lower end of the connection pin is easier.

Further, according to the plate spring-type connection pin according to the first embodiment or the second embodiment, it is required to cut off a small space between the support pin 110 and the plate spring 120 in the development view (see FIG. 5), but according to the plate spring-type connection pin according to the third embodiment, there is no need for cutting off a small space (see FIG. 11), so the possibility of damage to a punch or a die decreases, which is advantageous in mass production.

FIGS. 12*a* and 12*b* are views from which it is possible to see the fastening state of the plate spring-type connection pin according to the third embodiment of the present invention and a housing 30. Connection pins may be arranged with predetermined intervals respectively in several pin holes 32 formed in the thickness direction in an insulating body of the housing 30 so that the connection pins can be protected from deformation or external physical shock.

FIG. 12*a* shows a connection pin inserted in a pin hole 32 of a housing 30 made of an insulating material, which is a side view showing the state before an external force is applied from above to the upper probe portion 121 of a plate spring.

The connection pin is vertically inserted in the pin hole of the housing 30 with the upper probe portion 121 and the bridge 130 protruding from the top and the bottom of the housing 30. Further, a protrusion 117 that comes in contact with the side of the pin hole 32 is formed at the support pin 110, in detail, at the first base portion 115 of the support pin 110. Further, another protrusion (not shown) that comes in contact with the side of the pin hole 32 may be formed at the second base portion 126. The protrusion enables the connection pin to be easily inserted into the pin hole 32 of the housing 30 and prevents the connection pin from being easily separated from the housing 30 even if the assembly of the connection pin and the housing 30 is moved or turned over during or after the manufacturing process.

FIG. 12*b* shows the state in which the upper probe portion 121 has been moved down by compressing and contract the V-shaped portion 123 by applying an external force to the upper probe portion 121 of the integrated plate spring-type connection pin according to the present invention inserted in the pin hole 32 of the housing 30, for example, through a semiconductor package disposed on the upper probe portion. When the connection pin according to the present invention is pressed and the V-shaped portion 123 is contracted, the V-shaped portion can be effectively elastically deformed by bending of the bending portion 123*c* of the V-shaped portion.

When the upper probe portion 121 moves down and comes in contact with the lip portion 111, two paths are provided through the support pin 110 and the plate spring 120 in the connection pin of the present invention, a shortest path of an electrical signal can be provided, and the cross-section of an electrical path is increased, thereby being able to reduce loss of an electrical signal.

As well known to those skilled in the art, the plate spring-type connection pins according to the embodiments of the present invention can be applied to a socket that electrically connects a semiconductor device and a PCB, etc. Further, the plate spring-type connection pins can also be used for a semiconductor package inspection socket the electrically connects an objective device and a test board so that a semiconductor device can be inspected.

Although the present invention was described above through embodiments, this is for describing the present invention in detail and the plate spring-type connection pin according to the present invention is not limited thereto. Further, it is apparent that the present invention may be changed and modified by those skilled in the art within the spirit of the present invention. Simple changes and modifications of the present invention are included in the range of the present invention and the detailed protection range of the present invention will be made clear by claims.

The invention claimed is:

1. A plate spring-type connection pin comprising:
   a support pin (110) that has a bending lip portion (111) at an upper portion thereof and a base portion (115) at a lower portion thereof, and is vertically elongated;
   a plate spring (120) that has an upper probe portion (121) vertically extending adjacent to the lip portion (111), a lower probe portion (125) disposed at the same height as the base portion (115), a laterally lying V-shaped portion (123) disposed between the upper probe portion (121) and the lower probe portion (125), an upper bending portion (122) connecting an upper end of the V-shaped portion (123) and a lower end of the upper probe portion (121) to each other, and a lower bending portion (124) connecting a lower end of the V-shaped portion (123) and an upper end of the lower probe portion (125) to each other, and that is disposed at a predetermined distance from the support pin (110); and
   a bridge (130) that is disposed between the base portion (115) of the support pin (110) and the lower probe portion (125) of the plate spring (120), wherein the upper probe portion (121) of the plate spring (120) can be reciprocated up and down by elasticity of the V-shaped portion (123).

2. A plate spring-type connection pin comprising:
   a support pin (110) that has a bending lip portion (111) at an upper portion thereof and a first base portion (115) at a lower portion thereof, and is vertically elongated;
   a plate spring (120) that has an upper probe portion (121) vertically extending adjacent to the lip portion (111), a second base portion (126) disposed at the same height as the first base portion (115), a laterally lying V-shaped portion (123) disposed between the upper probe portion (121) and the second base portion (126), an upper bending portion (122) connecting an upper end of the V-shaped portion (123) and a lower end of the upper probe portion (121) to each other, and a lower bending portion (124) connecting a lower end of the V-shaped portion (123) and an upper end of the second base portion (126) to each other, and that is disposed at a predetermined distance from the support pin (110); and a bridge (130) that is disposed between the first base portion (115) of the support pin (110) and the second base portion (126) of the plate spring (120), wherein the bridge (130) bends from a lower end of the first base portion (115) and a lower end of the second base portion (126), thereby connecting the first base portion and the second base portion to each other and functioning as a lower probe.

3. The plate spring-type connection pin of claim 1, wherein an inner surface of the upper probe portion (121) is disposed to be able to come in contact with an inner surface of the lip portion (111).

4. The plate spring-type connection pin of claim 1, wherein the V-shaped portion (123) has a first inclined portion (123a) tapered upward, a second inclined portion (123b) tapered downward, and a bending portion (123c) elastically connecting the first inclined portion (123a) and the second inclined portion (123b) to each other.

5. The plate spring-type connection pin of claim 4, wherein a length (L123a) of the first inclined portion (123a) is larger than a length (L123b) of the second inclined portion (123b).

6. The plate spring-type connection pin of claim 4, wherein a width (W123) of the bending portion is larger than a width (W122) of the upper bending portion (122) and a width (L124) of the lower bending portion (124).

7. The plate spring-type connection pin of claim 1, wherein the plate spring (120) is made of a plate member having a rectangular cross-section.

8. The plate spring-type connection pin of claim 1, wherein the lower probe portion (125) is disposed in a direction having an inclination angle (θ) with respect to the support pin (110) before being mounted in a housing.

9. The plate spring-type connection pin of claim 1, wherein the plate spring (120) further has an extension portion (126) bending from a lower end of the lower probe portion (125) to the base portion (115), and a length (L126) of the extension portion (126) is smaller than a length (L130) of the bridge (130).

10. The plate spring-type connection pin of claim 1, wherein the support pin (110) further has a pair of locking steps (116) protruding in a width direction from both edges.

11. The plate spring-type connection pin of claim 1, wherein the support pin (110), the plate spring (120), and the bridge (130) are formed as a single part.

12. The plate spring-type connection pin of claim 1, wherein a gap is maintained between the lip portion (111) and the upper probe portion (121) in a free state, so plating is possible.

13. The plate spring-type connection pin of claim 1, wherein the connection pin (1) is vertically inserted in a pin hole of the housing (30) with the upper probe portion (121) and the lower probe portion (125) protruding outside from a top and a bottom of the housing 30, and the housing (30) has a space portion (32) providing a space in which the lip portion (111) can be bent backward when the upper probe portion (121) moves down in contact with the lip portion (111).

14. The plate spring-type connection pin of claim 2, wherein the connection pin (1) is vertically inserted in a pin hole of the housing (30) with the upper probe portion (121) and the bridge (130) protruding outside from a top and a bottom of the housing 30, and the support pin (110) has a protrusion (1117) coming in contact with a side of the pin hole.

15. The plate spring-type connection pin of claim 2, wherein an inner surface of the upper probe portion (121) is disposed to be able to come in contact with an inner surface of the lip portion (111).

16. The plate spring-type connection pin of claim 2, wherein the V-shaped portion (123) has a first inclined portion (123a) tapered upward, a second inclined portion (123b) tapered downward, and a bending portion (123c) elastically connecting the first inclined portion (123a) and the second inclined portion (123b) to each other.

17. The plate spring-type connection pin of claim 2, wherein the plate spring (120) is made of a plate member having a rectangular cross-section.

18. The plate spring-type connection pin of claim 2, wherein the support pin (110) further has a pair of locking steps (116) protruding in a width direction from both edges.

19. The plate spring-type connection pin of claim 2, wherein the support pin (110), the plate spring (120), and the bridge (130) are formed as a single part.

20. The plate spring-type connection pin of claim 2, wherein a gap is maintained between the lip portion (111) and the upper probe portion (121) in a free state, so plating is possible.

* * * * *